United States Patent [19]

Dyke

[11] 4,413,240

[45] Nov. 1, 1983

[54] AUTOMATIC LINE BUILDOUT CIRCUIT FOR DIGITAL DATA TRANSMISSION

[75] Inventor: Harry J. Dyke, Oak Forest, Ill.

[73] Assignee: Rockwell International Cororation, El Segundo, Calif.

[21] Appl. No.: 319,840

[22] Filed: Nov. 9, 1981

[51] Int. Cl.³ ............................................ H03H 11/06
[52] U.S. Cl. .................... 333/17 R; 178/45; 179/16 F; 307/521; 333/28 R
[58] Field of Search ............... 333/17 R, 18; 307/521; 178/45, 69 R; 375/14; 179/1 D, 16 F, 170 R, 170 D; 330/109

[56] References Cited

U.S. PATENT DOCUMENTS

| | | | |
|---|---|---|---|
| 3,528,040 | 9/1970 | Galvin | 330/109 X |
| 3,578,914 | 5/1971 | Simonelli | 333/18 X |
| 3,644,847 | 2/1972 | Neuman | 333/17 R |
| 3,667,052 | 5/1972 | Effenberger | 333/17 R X |
| 3,924,199 | 12/1975 | Pearlman | 330/107 |
| 4,007,340 | 2/1977 | Russell | 179/170 R |

Primary Examiner—Paul L. Gensler
Attorney, Agent, or Firm—V. Lawrence Sewell; Howard R. Greenberg; H. Fredrick Hamann

[57] ABSTRACT

There is disclosed an automatic line buildout circuit which includes in its signal path two variable filters, each implemented by a transconductance operational amplifier circuit. Each filter exhibits a transfer function pole with a frequency which is directly related to a control current applied to that filter. At a point in the signal path after the two variable filters, there is a peak detector which provides an output level proportional to the peak amplitude of the signal in the path, and therefore proportional to the cable length. From the peak detector output level, there is derived for each of the variable filters a control current, related to the output level by a preselected function. For each variable filter, the associated function expresses the relation between cable length and the filter cutoff frequency which is required for proper equalization.

5 Claims, 3 Drawing Figures

4,413,240

AUTOMATIC LINE BUILDOUT CIRCUIT FOR DIGITAL DATA TRANSMISSION

BACKGROUND OF THE INVENTION

This invention relates to an automatic line buildout circuit which can equalize a cable of any length in the operational range of a digital data transmission network that operates at customer data rates over local cable pairs, such as in the Bell System DDS network.

SUMMARY OF THE INVENTION

The present invention provides an automatic line buildout circuit which includes in its signal path two variable filters, in cascade, each implemented ty a transconductance operational amplifier circuit. Each filter exhibits a transfer function pole with a frequency which is directly related to a control current applied to that filter. In a point in the signal path after the two variable filters, there is a peak detector which provides an output level proportional to the peak amplitude of the signal in the path, and therefore proportional to the cable length. From the peak detector output level, there is derived for each of the variable filters a control current, related to the output level by a preselected function. For each variable filter, the associated function expresses the relation between cable length and the filter cutoff frequency which is required for proper equalization.

The commonly used circuit for automatic line buildout is suitable for operation only over restricted cable lengths and requires insertion of fixed equalizers as the cable loss exceeds a predetermined amount. The present invention provides automatic line buildout which is continuous over the entire cable length range without the need for additional fixed equalizers.

It is an advantage of the present invention that an empirically determined variation of required filter cutoff frequency versus cable length can be readily translated into a practical equalizer circuit. The required function is implemented in the current sources of the circuit of the invention, thereby providing cutoff frequency control according to the function. By way of example, it has proven to be particularly straightforward to implement automatic equalizers for operation over cable in various signal frequency ranges.

It is an additional advantage of the invention that the variable filters are implemented by transconductance operational amplifier circuits, rather than FET's as in the prior art, because the filter cutoff frequency is more well defined in response to the control signal in the present invention.

DESCRIPTION OF PREFERRED EMBODIMENT

Figure 1:
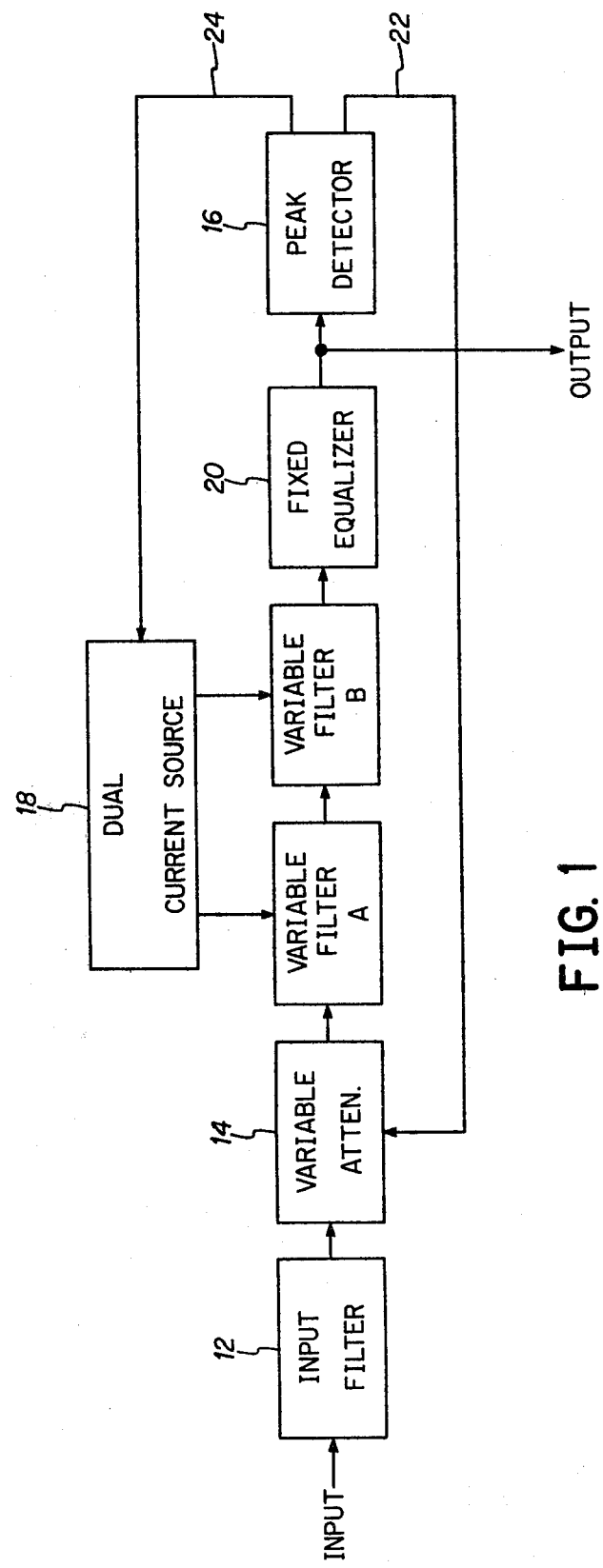
FIG. 1 is a block diagram of an automatic line buildout circuit according to the invention.

The overall operation of the automatic line buildout circuit of the present invention can be understood from a consideration of the block diagram in FIG. 1. A low pass input filter 12 with a cutoff frequency of approximately twice the data rate provides high frequency rejection. A variable attenuator 14 inserts a flat loss under the control of a peak detector 16, maintaining the output of the line buildout circuit at a constant amplitude. Variable filters A and B are each single pole filters controlled by an exponential current source 18, which is in turn also controlled by peak detector 16. The output of variable filter B is applied to fixed equalizer 20, which has gain and a fixed frequency response zero to provide the equalization required at the maximum expected cable length. The output of the fixed equalizer 20 is the output of the line buildout circuit, and is an input to peak detector 16.

The peak detector 16 provides a control output 24 which is related to the cable length, as can be determined from the amplitude of the signal at the input to the detector 16. The control output 24 drives variable filters A and B by means of current source 18, so as to provide the response shown in FIG. 2. As seen there, the cutoff frequency of filters A and B must vary in a particular fashion with the length of the cable which is to be equalized. At the maximum cable length, the variable filters are essentially unity gain amplifiers for the signal frequencies of interest, and the single pole exhibited by the cable is equalized by the zero of fixed equalizer 20. As the cable length becomes less than the maximum, the variable filter A provides a pole which combines with the cable response to behave as a cable of maximum length. Therefore, the cable is still equalized by the fixed equalizer 20. Expressed differently, the pole of variable filter A counteracts the zero of fixed equalizer 20. For zero cable length, the pole of filter A cancels the zero of the fixed equalizer.

Figure 2:
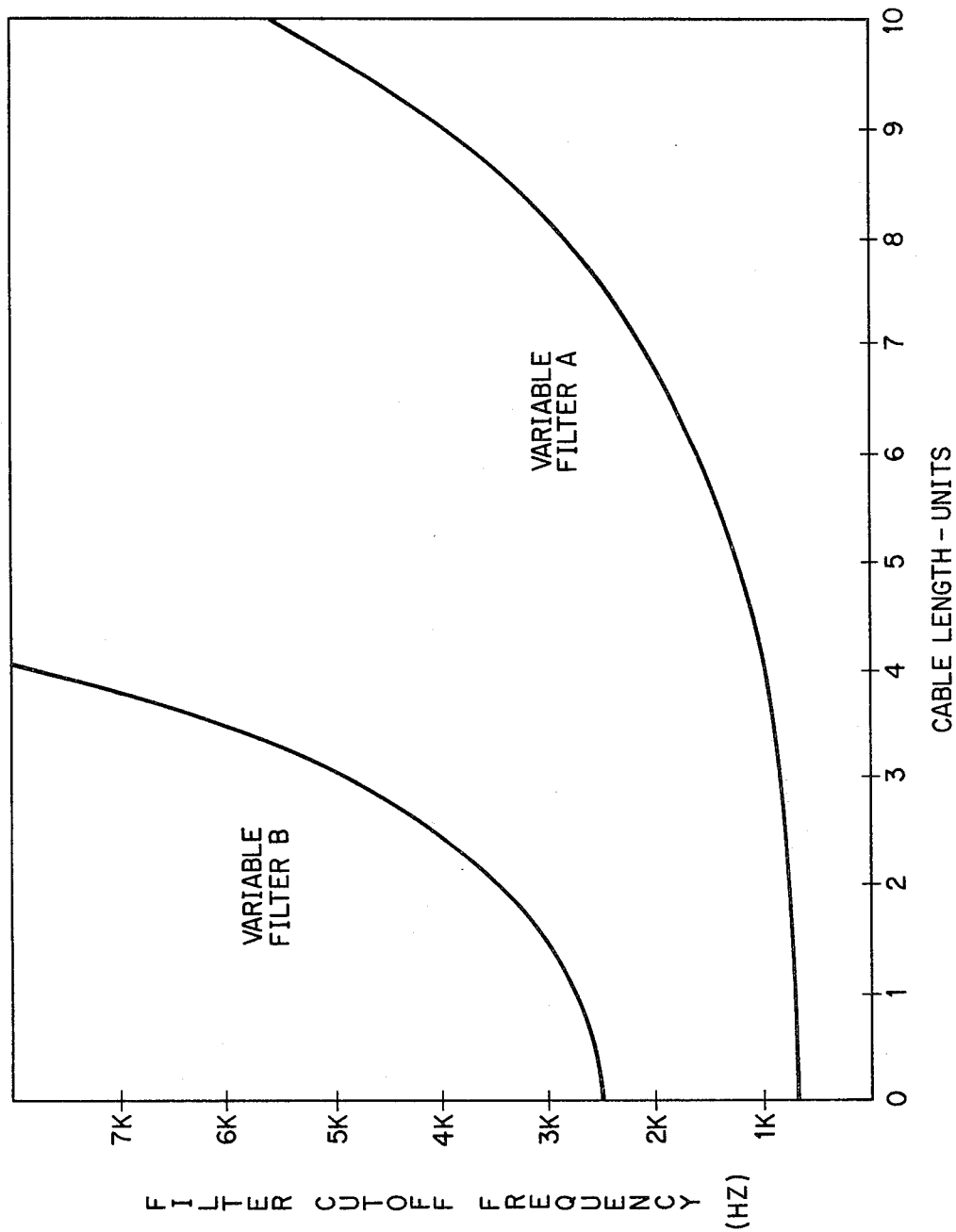
FIG. 2 is a plot of the required cutoff frequencies for variable filters in the system of FIG. 1, versus cable length.

For the cable response requiring the filtering of FIG. 2, a second pole becomes important at shorter cable lengths. In the line buildout circuit of FIG. 1, this pole is equalized for maximum cable length by a zero included in the response of input filter 12. The inclusion of this zero in the input filter (near its cutoff frequency), along with two poles improves the input filtering, in addition to providing equalization. At short cable lengths, the pole of filter B counteracts the zero of the input filter; at zero cable length, the pole cancels the zero.

For cable operation not corresponding to FIG. 2, particularly for operation with higher frequency signals, the cable may not exhibit a second pole at short cable lengths. A line buildout circuit designed for such operation in accordance with the invention would not require variable filter B.

Figure 3:
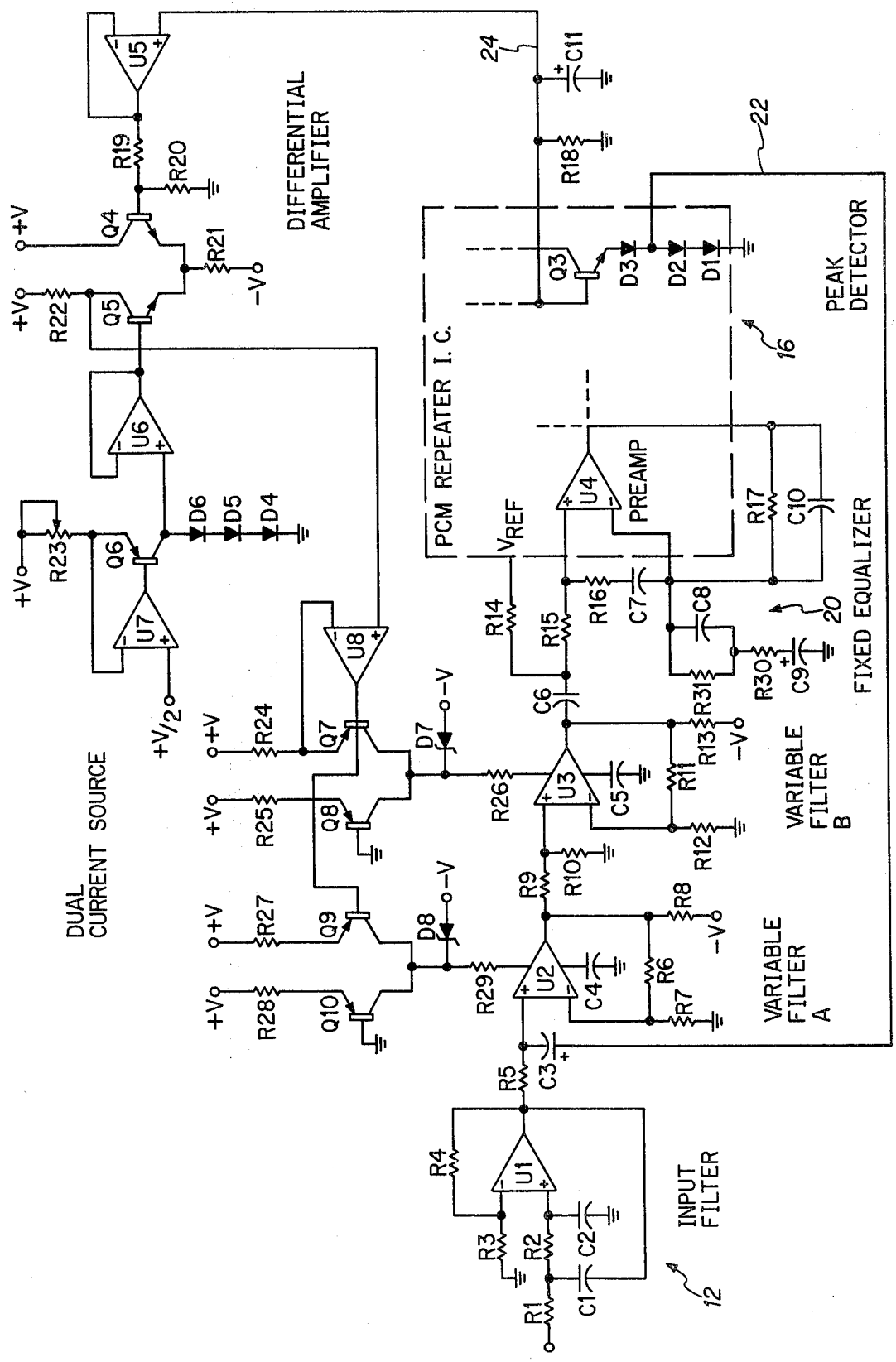
FIG. 3 is a schematic diagram of the circuit of FIG. 1.

Details of a preferred embodiment of the line buildout circuit of the invention are shown in the schematic diagram of FIG. 3. The input filter 12 comprises an operational amplifier U1 connected in a second order low pass filter configuration with resistors R3 and R4 selected to adjust the damping and gain of the filter for a 3 dB peaked response at approximately the data rate. As mentioned above, the response effectively generates a second zero in conjunction with the fixed equalizer 20 and provides a faster roll-off which improves the transient response of the input pulses.

The variable attenuator 14 (FIG. 1) is controlled by control output 22 of peak detector 16. In a tested embodiment, peak detector 16 is a part of a C262 PCM repeater integrated circuit made by Exar Integrated Systems, Sunnyvale, Calif. Fixed equalizer 20 can also employ an operational amplifier of this integrated circuit, as shown in FIG. 3. The portions of the fixed equalizer and peak detector which are on the integrated circuit are enclosed by broken lines. The peak detector employs a string of PN junctions or diodes D1–D3, developing a voltage across the diodes which is proportional to the peak amplitude of the signal into the peak detector. This voltage is taken at the base of transistor Q3 as the output level or control output 24 of the peak detector.

Diodes D1–D3 of the repeater integrated circuit form, along with resistor R5 and capacitor C3, the variable attenuator 14 (FIG. 1). Because of the capacitive coupling of capacitor C3, it is the dynamic impedance of the diodes D1–D3, along with that of the base-emitter junction of transistor Q3, which controls the variable attenuation provided. This dynamic impedance is inversely related to the current through the diodes, the current being, in turn, related to the length of the cable to be equalized. The variable attenuation achieves the flat loss necessary to correct for the length of the cable.

Variable filter A and variable filter B are formed by transconductance operational amplifiers U2 and U3, respectively, connected as variable filters, as is well understood in the art. The amplifiers U2 and U3 can be, for example, National Semiconductor Device LM13600.

The fixed equalizer is formed around preamplifier U4 of the integrated circuit, by resistors R17, R30, R31 and capacitor C8, which establish a transfer function zero. From the output of preamp U4, the signal is taken to the output of the automatic line buildout circuit and to the peak detector 16, by the remainder of the integrated circuit, not shown.

Control output level 24 from peak detector 16 is applied by amplifier U5 through a voltage divider comprised of resistors R19 and R20, to one input of a differential amplifier. The differential amplifier, comprised of transistors Q4 and Q5 and resistors R21 and R22, receives as its other input a reference voltage at the base of transistor Q5. The fixed reference voltage is provided by the circuit which includes amplifiers U6 and U7, transistor Q6 and temperature stabilizing diodes D4–D6. The variable input to the differential amplifier is large enough so that the amplifier operates out of its linear range. As a result, and as is well understood in the art, the output voltage of the differential amplifier, at the collector of transistor Q5, varies exponentially with the input at the base of transistor Q4, in accordance with the functions shown in FIG. 2.

The desired variation of the differential amplifier output voltage with input is obtained by selection of the operating range of the amplifier. This selection is made by choosing voltage divider resistors R19 and R20 to set the input range and choosing resistor R23 at the emitter of transistor Q6 to establish the fixed reference voltage.

Transistors Q9 and Q10, with resistors R27 and R28 form a current source applying control current through resistor R29 to variable filter A. The variation of the control current with cable length is provided by transistor Q9, controlled by the voltage at the collector of transistor Q5, so the current exhibits the exponential variation shown in FIG. 2. This variable current adds to a fixed current from transistor Q10, so as to provide a control current, which is described by the function of FIG. 2.

A second source, comprising transistors Q7 and Q8 and resistors R24 and R25, supplies a control current in the same way to variable filter B through resistor 26. The resistors of the two current sources are adjusted to provide the two different functions of filter cut-off frequency versus cable length shown in FIG. 2. For the particular function shown in that figure, resistor R24 is selected to be twice the value of resistor R22, essentially multiplying the collector current of transistor Q5 and providing the desired rate of change of cutoff frequency required by a variable filter B. Resistor R27 is selected to be one half the value of R22, essentially dividing the collector current of transistor Q5 and providing the rate of change of cutoff frequency required for variable filter A.

As is well known in the art, the cutoff frequencies of the variable filters A and B are directly related to the control current supplied by the current sources. That is, if the control current is increased, the cutoff frequency increases. Thus, if the control current to each one of the filters A and B can be made to vary with cable length as required, the cutoff frequency of the filter will vary correspondingly. Since the peak detector 16 provides a control output level 24 which varies directly with cable length, it is necessary to provide a control current to each variable filter which varies with the control level 24 according to the functions shown in FIG. 2.

In the preferred embodiment shown, the basic exponential variation required is provided by the response of the differential amplifier. The two particular functions for variable filters A and B are then further derived by adjustment of resistors R24, R25, R27 and R28. It can be understood that once the functions of FIG. 2 have been plotted from experiments with the cable, then they can be relatively straightforwardly implemented by adjusting the current source resistors, and the operating point of the differential amplifier, to implement these functions in hardware. It is this ease of implementation which represents a primary advantage of the invention. The circuit of the invention is highly versatile, in that a wide range of cutoff frequency functions can be synthesized by the selection of the resistors in the differential amplifier and current sources.

I claim:

1. An automatic line buildout circuit for equalizing a cable in response to a signal therefrom, comprising:
  a variable filter in the path of said signal, having a transconductance operational amplifier connected to provide a transfer function pole with a frequency which is directly related to a control current to be applied to the filter;
  peak detector means responsive to the signal in said path after filtering by said variable filter, for providing an output level approximately proportional to the length of said cable; and
  current source means for generating said control current as a selected function of said peak detector means output level, thereby causing the frequency associated with said pole to vary with the cable length according to said selected function, said selected function being defined by said control current increasing exponentially with increasing peak detector means output level.

2. An automatic line buildout circuit for equalizing a cable in response to a signal therefrom, comprising:
  a fixed filter in the path of said signal;
  a variable filter responsive to the output of said fixed filter, having a transconductance operational amplifier connected to provide a transfer function pole with a frequency which is directly related to a control current to be applied to the filter;

peak detector means responsive to the signal in said path after filtering by said variable filter, for providing an output level approximately proportional to the length of said cable; and current source means for generating said control current as a selected function of said peak detector means output level, thereby causing the frequency associated with said pole to vary with the cable length according to said selected function, said selected function being selected to counteract the effect of said fixed filter at lengths of said cable shorter than the maximum.

3. An automatic line buildout circuit for equalizing a cable in response to a signal therefrom, comprising:

a fixed input filter responsive to the signal from said cable;

a variable attenuator responsive to the output of the input filter;

a first variable filter, responsive to the output of the variable attenuator, and having a transconductance operational amplifier circuit connected to provide a first transfer function pole with a frequency which is directly related to a first control current to be applied to the variable filter;

a second variable filter, responsive to the output of the first variable filter, and having a transconductance operational amplifier connected to provide a second transfer function pole, with a frequency which is directly related to a second control current to be applied to the second variable filter;

a fixed equalizer responsive to the output of the second variable filter, and exhibiting a transfer function zero;

peak detector means responsive to the output of the fixed equalizer and including plural diodes connected in series, with means for controlling said variable attenuator in relation to the dynamic impedance of said diodes and means for providing, as an output level, a voltage across said diodes proportional to the peak amplitude of the output from the fixed equalizer, and thereby proportional to the length of the cable;

means, including a differential amplifier, for producing a voltage having a preselected functional relationship to said peak detector means output level;

first current source means, responsive to said produced voltage, for generating one of said control currents, varying as a first function of said output level, to thereby counteract the effect of the fixed equalizer at lengths of said cable shorter than the maximum; and second current source means responsive to said produced voltage, for generating another of the control currents, varying as a second function of said output level, thereby to counteract the effect of the input filter at said shorter lengths of said cable.

4. An automatic line buildout circuit for equalizing a cable in response to a signal therefrom, comprising:

a fixed input filter responsive to the signal from said cable;

a variable attenuator responsive to the output of the input filter;

a first variable filter, responsive to the output of the variable attenuator, and having a transconductance operational amplifier circuit connected to provide a first transfer function pole with a frequency which is directly related to a first control current to be applied to the variable filter;

a second variable filter, responsive to the output of the first variable filter, and having a transconductance operational amplifier connected to provide a second transfer function pole, with a frequency which is directly related to a second control current to be applied to the second variable filter;

a fixed equalizer responsive to the output of the second variable filter, and exhibiting a transfer function zero;

peak detector means responsive to the output of the fixed equalizer for controlling said variable attenuator and for providing an output level which is proportional to the peak amplitude of the output from the fixed equalizer and, thereby, proportional to the length of the cable;

first current source means, responsive to said output level, for generating one of said control currents, varying as a first selected function of said output level, to thereby counteract the effect of the fixed equalizer at lengths of said cable shorter than the maximum; and second current source means responsive to said output level for generating another of the control currents, varying as a second selected function of said output level, thereby to counteract the effect of the input filter at said shorter lengths of said cable.

5. An automatic line buildout circuit for equalizing a cable in response to a signal therefrom, comprising:

a first variable filter in the path of said signal, having a transconductance operational amplifier connected to provide a first transfer function pole with a frequency which is directly related to a first control current to be applied to the variable filter;

a second variable filter, responsive to the output of the first variable filter, and having a transconductance operational amplifier connected to provide a second transfer function pole with a frequency which is directly related to a second control current to be applied to the second variable filter;

peak detector means responsive to the signal in said path after filtering by said variable filters, for providing an output level approximately proportional to the length of said cable; and first current source means for generating said first control current as a first selected function of said peak detector means output level, thereby causing the frequency associated with said first pole to vary with the cable length according to said first selected function; and second current source means for generating said second control current as a second, different selected function of said peak detector means output level, thereby causing the frequency associated with said second pole to vary with the cable length according to said second selected function.

* * * * *